(12) United States Patent
Sakamoto

(10) Patent No.: US 9,594,252 B2
(45) Date of Patent: Mar. 14, 2017

(54) LD MODULE

(71) Applicant: FUJIKURA LTD., Tokyo (JP)

(72) Inventor: Shinichi Sakamoto, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/009,142

(22) Filed: Jan. 28, 2016

(65) Prior Publication Data

US 2016/0147025 A1    May 26, 2016

(30) Foreign Application Priority Data

Jul. 31, 2013    (JP) ................................ 2013-159333

(51) Int. Cl.
| | |
|---|---|
| *G02B 6/26* | (2006.01) |
| *G02B 6/42* | (2006.01) |
| *G02B 6/32* | (2006.01) |
| *G02B 6/34* | (2006.01) |
| *G02B 27/10* | (2006.01) |
| *G02B 27/09* | (2006.01) |
| *H01S 5/40* | (2006.01) |
| *H01S 5/00* | (2006.01) |
| *H01S 5/022* | (2006.01) |
| *G02B 6/28* | (2006.01) |

(52) U.S. Cl.
CPC ........... *G02B 27/10* (2013.01); *G02B 6/4214* (2013.01); *G02B 27/0905* (2013.01); *G02B 27/0916* (2013.01); *H01S 5/4012* (2013.01); *G02B 6/2817* (2013.01); *G02B 6/4206* (2013.01); *H01S 5/005* (2013.01); *H01S 5/0071* (2013.01); *H01S 5/02252* (2013.01); *H01S 5/02284* (2013.01)

(58) Field of Classification Search
CPC .............. G02B 6/4214; G02B 27/0905; G02B 27/0916; G02B 27/10; H01S 5/4012
USPC ................................................ 385/33, 36, 47
See application file for complete search history.

(56) References Cited

U.S. PATENT DOCUMENTS

| | | | | |
|---|---|---|---|---|
| 5,418,880 A | * | 5/1995 | Lewis ...................... | G02B 5/04 359/625 |
| 5,513,201 A | * | 4/1996 | Yamaguchi ............ | G02B 6/425 372/70 |
| 5,629,791 A | | 5/1997 | Harrigan | |

(Continued)

FOREIGN PATENT DOCUMENTS

| | | |
|---|---|---|
| CN | 102576973 A | 7/2011 |
| CN | 203071399 U | 7/2013 |

(Continued)

OTHER PUBLICATIONS

International Search Report dated Aug. 12, 2014, issued in counterpart application No. PCT/JP2014/069047 (1 page).

(Continued)

*Primary Examiner* — Robert Tavlykaev
(74) *Attorney, Agent, or Firm* — Westerman, Hattori, Daniels & Adrian, LLP

(57) ABSTRACT

In an LD module of the present invention, a plurality of laser diodes emit a plurality of laser beams toward a corresponding plurality of mirrors so that intervals between adjacent ones of the laser beams gradually increase, and the plurality of mirrors reflect the plurality of laser beams toward the fast axis focusing lens so that intervals between adjacent ones of the laser beams gradually decrease.

7 Claims, 8 Drawing Sheets

(56) References Cited

U.S. PATENT DOCUMENTS

| | | | | |
|---|---|---|---|---|
| 5,877,898 A * | 3/1999 | Hollemann | ........... | G02B 27/143 |
| | | | | 359/619 |
| 6,028,722 A * | 2/2000 | Lang | ...................... | G02B 27/09 |
| | | | | 359/834 |
| 7,773,653 B2 * | 8/2010 | Voss | ......................... | G02B 5/08 |
| | | | | 372/33 |
| 2004/0233964 A1 | 11/2004 | Yamanaka et al. | | |
| 2004/0252388 A1 | 12/2004 | Yamanaka et al. | | |
| 2006/0126690 A1 * | 6/2006 | Kido | ...................... | G02B 6/425 |
| | | | | 372/43.01 |
| 2009/0245315 A1 * | 10/2009 | Faybishenko | ........ | G02B 6/4206 |
| | | | | 372/50.12 |
| 2012/0027043 A1 | 2/2012 | Valk | | |

FOREIGN PATENT DOCUMENTS

| | | | | |
|---|---|---|---|---|
| DE | 102010038571 A1 | 2/2012 | | |
| JP | 07-098402 | * | 4/1995 | ........... H01S 5/4025 |
| JP | 2001-215443 | * | 10/2001 | ............. G02B 27/09 |
| JP | 2003-309309 A | | 10/2003 | |
| JP | 2004-252428 A | | 9/2004 | |
| JP | 2004-258624 A | | 9/2004 | |

OTHER PUBLICATIONS

Decision to Grant a Patent dated Jul. 29, 2014, issued in counterpart application No. JP2013-159333 (1 page).
Office Action dated Jul. 22, 2016, issued in counterpart Chinese Application No. 201480042718.5. (5 pages).
Extended (Supplementary) European Search Report dated Jun. 23, 2016, issued in counterpart European Patent Application No. 14832180.5.(6 pages).

* cited by examiner

LD MODULE

CROSS-REFERENCE TO RELATED APPLICATIONS

This application is a Continuation of PCT International Application No. PCT/JP2014/069047 filed in Japan on Jul. 17, 2014, which claims the benefit of Patent Application No. 2013-159333 filed in Japan on Jul. 31, 2013, the entire contents of which are hereby incorporated by reference.

TECHNICAL FIELD

The present invention relates to a laser diode module which emits and combines a plurality of laser beams.

BACKGROUND ART

Laser diode (LD) modules capable of producing high-power and high-intensity laser beams by coupling a plurality of laser beams emitted from a plurality of laser diodes into optical fibers have conventionally been used widely. For example, Patent Document 1 discloses a micro-optical device in which (i) a plurality of laser beams parallel to each other are reflected by a prism so that a direction of travel of the laser beams are converted, and (ii) the laser beams are then focused to be coupled into an optical fiber.

CITATION LIST

Patent Literature

[Patent Literature 1]
Japanese Patent Application Publication, Tokukai No. 2004-252428 (Publication date: Sep. 9, 2004)

SUMMARY OF INVENTION

Technical Problem

One approach for size reduction of an LD module is to decrease a curvature radius of a fast axis focusing lens so that a focal length of the fast axis focusing lens is shortened. This is because such an approach enables an incident end face of an optical fiber to be brought closer to the fast axis focusing lens. However, the decrease in curvature radius of the fast axis focusing lens causes laser beams having passed through the fast axis focusing lens to enter the optical fiber at a large incidence angle. As a result, coupling efficiency of the laser beams is decreased. Such a problem occurs because, of the laser beams having passed through the fast axis focusing lens, a laser beam(s) having an incidence angle larger than an acceptance angle of the optical fiber suffers loss(es) without being enclosed in a core of the optical fiber.

The present invention has been attained in view of the above problem. It is an object of the present invention to achieve size reduction of an LD module without decreasing coupling efficiency of laser beams.

Solution to Problem

In order to solve the above problem, an LD module in accordance with the present invention includes: a plurality of laser diodes forming a laser diode array; a plurality of mirrors which reflect a plurality of laser beams emitted from the corresponding plurality of laser diodes, in slow axis directions of the laser beams; and a fast axis focusing lens which focuses the plurality of laser beams reflected by the plurality of mirrors; the plurality of laser diodes emitting the plurality of laser beams toward the corresponding plurality of mirrors so that intervals between adjacent ones of the laser beams gradually increase, the plurality of mirrors reflecting the plurality of laser beams toward the fast axis focusing lens so that intervals between adjacent ones of the laser beams gradually decrease, the plurality of mirrors being configured to include: respective first mirrors; and respective second mirrors, the first mirrors each reflecting, in a fast axis direction, a corresponding one of the laser beams entering the mirrors; and the second mirrors each reflecting, in a slow axis direction, the corresponding one of the laser beams reflected by the first mirrors, the plurality of laser beams being such that a fast axis of a corresponding one of the laser beams entering the first mirrors is parallel to a slow axis of a corresponding one of the laser beams exiting from the second mirrors.

According to the above LD module, a plurality of laser beams are such that fast axes of the laser beams entering the first mirrors are parallel to slow axes of the laser beams exiting from the second mirrors. This allows the laser beams to exit from the second mirrors without causing twisting of the laser beams (described later). That is, according to the above LD module, a plurality of laser beams emitted from a plurality of mirrors are aligned with their slow axes parallel to each other, without being twisted. Thus, according to the above LD module, it is possible to densely place a plurality of mirrors so that a plurality of laser beams travel at small spacing therebetween, while preventing the occurrence of a defect such as an interference between laser beams, blocking of part of laser beams by an adjacent mirror, or a failure to focus part of laser beams. Therefore, according to the above LD module, it is possible to achieve size reduction of an LD module while preventing a decrease in coupling efficiency of laser beams.

For example, assume that there is employed a configuration (in which fast axes of the laser beams entering the first mirrors are not parallel to slow axes of the laser beams exiting from the second mirrors) other than the above configuration. Such a configuration causes twisting of laser beams. Thus, the laser beams exiting from the second mirrors have beam widths each expressed by [fast-axis beam width of a mirror entering the first mirror×sin θ (θ denotes a corrected angle of a direction in which the laser beam exits from the second mirror)]. In this case, setting a plurality of laser beams to travel at small spacing therebetween may lead to the occurrence of the aforementioned defect. In contrast, in a case where the above configuration (in which fast axes of the laser beams entering the first mirrors are parallel to slow axes of the laser beams exiting from the second mirrors) is employed, twisting of the laser beams does not occur. This allows beam widths of the laser beams exiting from the second mirrors to be substantially identical to fast-axis beam widths of the laser beams entering the first mirrors. Thus, even in a case where a plurality of laser beams are set to travel at small spacing therebetween, the aforementioned defect does not occur.

The above LD module employs the arrangement in which a plurality of laser beams are allowed to travel to the focusing lens in a slightly focused state. Without a need for decrease in curvature radius of the fast axis focusing lens, such an arrangement allows focal points of a plurality of laser beams to be formed at positions closer to the focusing lens, as compared to the arrangement in which a plurality of laser beams are allowed to travel to the focusing lens in a state being parallel to each other. Therefore, the above LD module allows an incident end face of the optical fiber to be brought at a position closer to the focusing lens, without having to decrease the curvature radius of the fast axis focusing lens. Consequently, it is possible to achieve size reduction of an LD module without decreasing the coupling efficiency of laser beams.

Advantageous Effects of Invention

According to the present invention, it is possible to achieve size reduction of an LD module without decreasing the coupling efficiency of laser beams.

DESCRIPTION OF EMBODIMENTS

The following will describe a laser diode (LD) module in accordance with an embodiment of the present invention with reference to the accompanying drawings.

[Configuration of LD Module]

Figure 1:
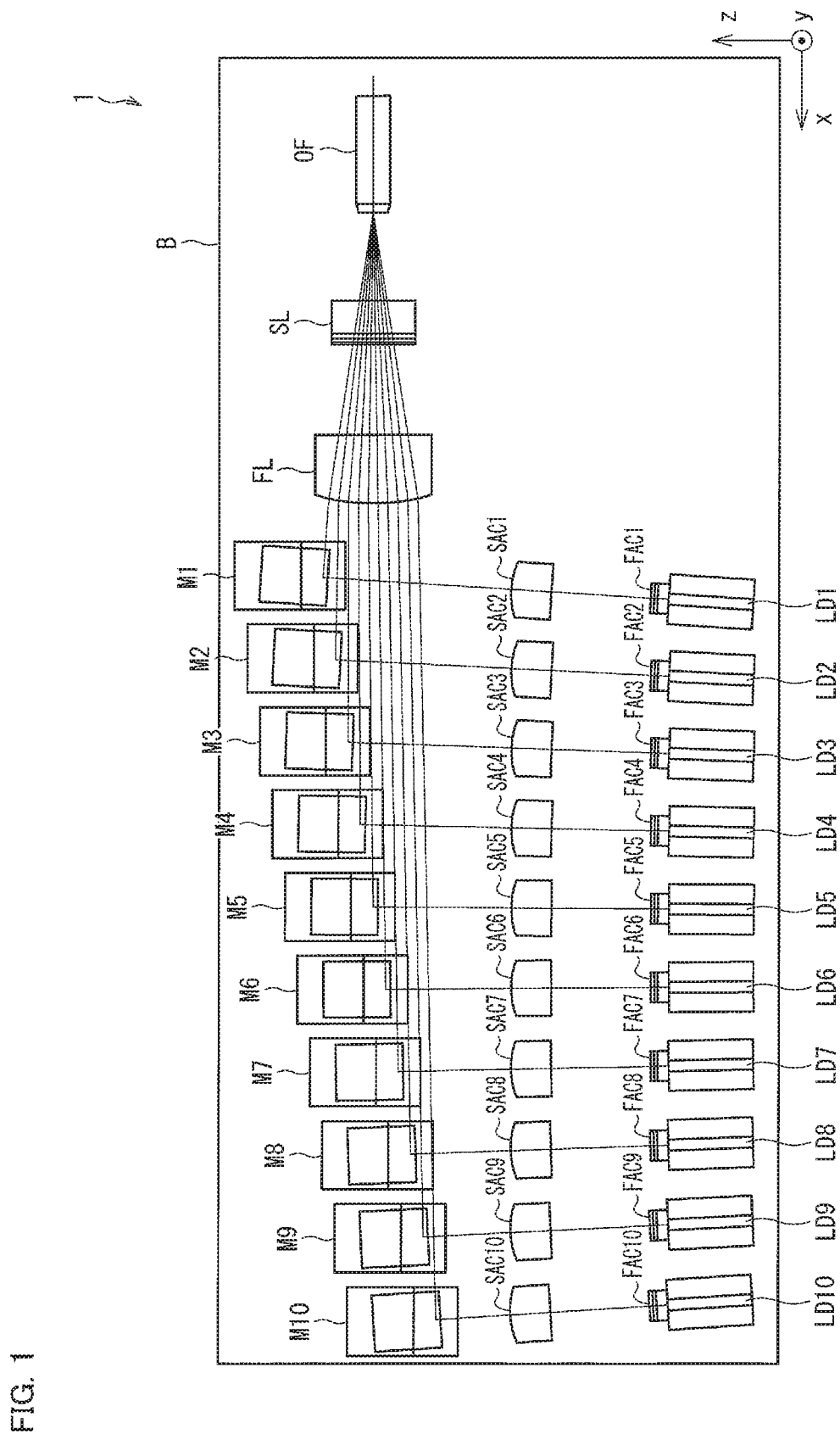
FIG. 1 is a top view illustrating the configuration of an LD module in accordance with the present embodiment.

First, the configuration of an LD module 1 in accordance with the present embodiment will be described with reference to FIG. 1. FIG. 1 is a top view illustrating the configuration of the LD module 1 in accordance with the present embodiment. The LD module 1 illustrated in FIG. 1 is such that a plurality of laser beams are emitted from a plurality of semiconductor laser diodes and then coupled into an optical fiber at a higher coupling efficiency. Particularly, FIG. 1 illustrates an example configuration in which 10 laser beams are coupled into an optical fiber.

Thus, the LD module 1 is configured to include semiconductor laser diodes LD1 to LD10, fast axis collimating lenses FAC1 to FAC10, slow axis collimating lenses SAC1 to SAC10, mirrors M1 to M10, a fast axis focusing lens FL, and a slow axis condensing lens SL (see FIG. 1).

(Semiconductor Laser Diodes)

The semiconductor laser diodes LD1 to LD10 are provided on individual chips. The semiconductor laser diodes LD1 to LD10 are placed on a surface of a sub-mount B along an x-axis direction shown in FIG. 1 so as to be spaced at substantially even intervals. That is, the semiconductor laser diodes LD1 to LD10 form a semiconductor laser diode array on the surface of the sub-mount B.

The semiconductor laser diodes LD1 to LD10 are placed on the surface of the sub-mount B in such a manner that active layers thereof are provided parallel to an x-z plane, and emission end faces thereof are directed toward a generally z-axis positive direction. With this configuration, a plurality of laser beams emitted from the semiconductor laser diodes LD1 to LD10 travel, in a space over the surface of the sub-mount B, in parallel to the x-z plane and toward the generally z-axis positive direction. Particularly, since the semiconductor laser diodes LD1 to LD10 are aligned along an x axis (see FIG. 1), the plurality of laser beams travel toward the z-axis positive direction while forming an array of laser beams being spaced at substantially even intervals and being parallel to each other. In the above description, a direction in which the laser beams travel is expressed as "the generally z-axis positive direction." This is because the direction in which the semiconductor laser diodes emit laser beams is slightly inclined toward the x-axis direction (slow axis direction) with respect to the z-axis positive direction, as described later.

[Configuration of Unit Optical System]

The LD module 1 is configured to include a plurality of unit optical systems one-to-one corresponding to the laser beams. That is, in an example configuration illustrated in FIG. 1, the LD module 1 includes 10 unit optical systems in conformity with 10 laser beams to be emitted. Each unit optical system Si (wherein i is an integer from 1 to 10) is configured to include a semiconductor laser diode LDi (wherein i is an integer from 1 to 10), a fast axis collimating lens FACi (wherein i is an integer from 1 to 10), a slow axis collimating lens SACi (wherein i is an integer from 1 to 10), and a mirror Mi (wherein i is an integer from 1 to 10). The following will describe a specific configuration of each unit optical system.

Figure 2:
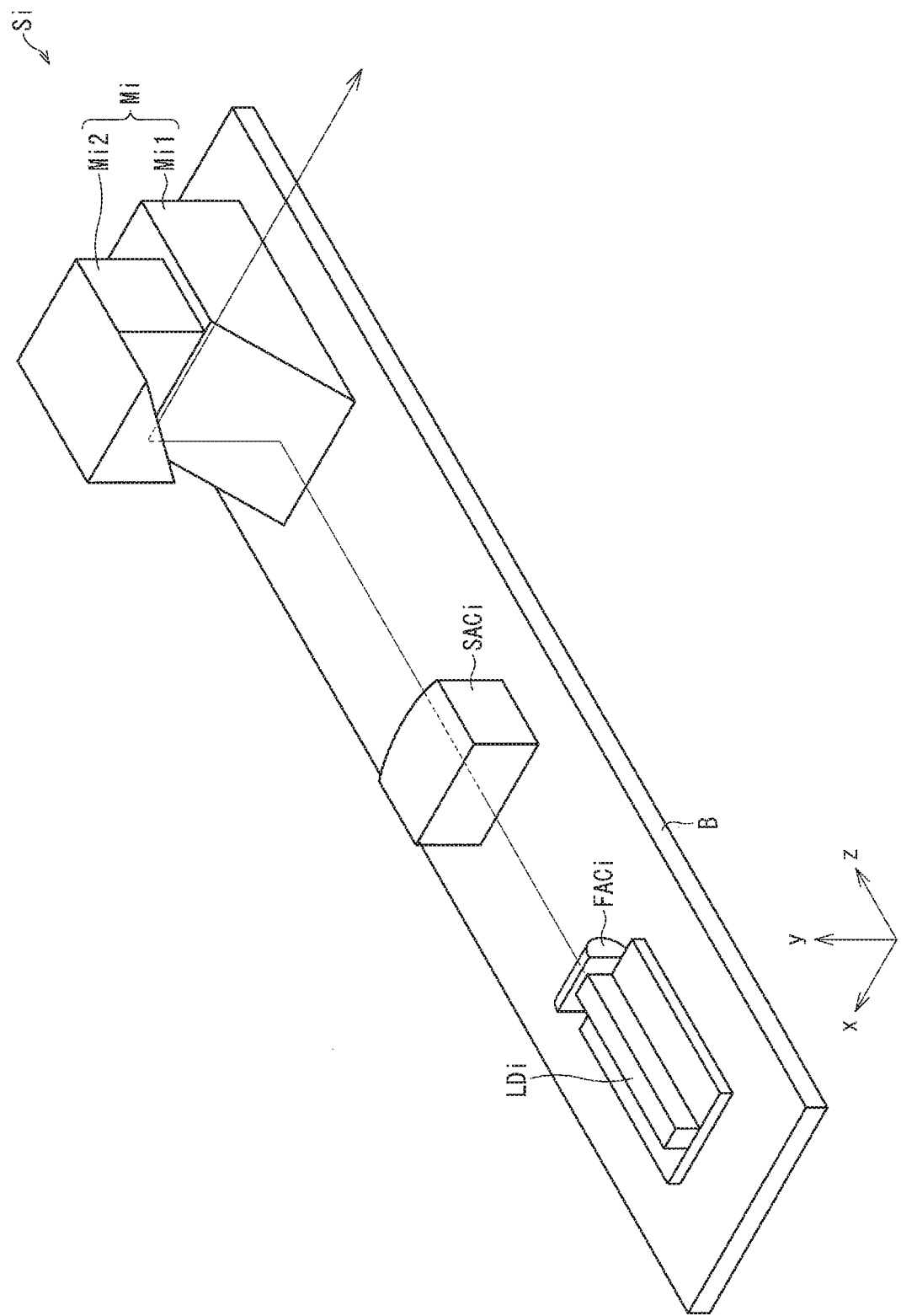
FIG. 2 is a perspective view illustrating the configuration of a unit optical system provided in the LD module in accordance with the present embodiment.

FIG. 2 is a perspective view illustrating the configuration of a unit optical system provided in the LD module 1 in accordance with the present embodiment. FIG. 2 illustrates the configuration of one of a plurality of unit optical systems provided in the LD module 1. It should be noted that the plurality of unit optical systems are each configured similarly to the unit optical system Si illustrated in FIG. 2.

As illustrated in FIG. 2, the unit optical system Si is configured such that a fast axis collimating lens FACi, a slow axis collimating lens SACi, and a mirror Mi are placed in sequence linearly on an optical path of a laser beam emitted from the semiconductor laser diode LDi. The components constituting the unit optical system Si are placed directly or via mounts (not illustrated) on the surface of the sub-mount B.

The fast axis collimating lens FACi is the one for collimating a laser beam emitted from the semiconductor laser diode LDi and spread out in a fast axis direction. The slow axis collimating lens SACi is the one for collimating a laser beam emitted from the semiconductor laser diode LDi and spread out in the slow axis direction. A laser beam passing through the fast axis collimating lens FACi and the slow axis collimating lens SACi is converted into a collimated beam whose travel direction is converged to the z-axis direction, and then travels toward the mirror Mi. In a case where the laser beam emitted from the semiconductor laser diode LDi is spread out in the slow axis direction in a sufficiently small extent, the slow axis collimating lens SACi may be omitted.

The mirror Mi is the one for converting, in order to lead the laser beam emitted from the semiconductor laser diode LDi to the fast axis focusing lens FL, a travel direction of the laser beam from the generally z-axis positive direction to the generally x-axis negative direction. As the mirror Mi, conventionally known mirrors of various kinds can be used. The mirror Mi used in the present embodiment is configured to include a first mirror (so-called "flip-up mirror") and a second mirror (so-called "fold mirror"). The first mirror converts the travel direction of the laser beam from the z-axis positive direction to a y-axis positive direction, and the second mirror converts the travel direction of the laser beam from the y-axis positive direction to an x-axis negative direction.

Here, as illustrated in FIG. 1, the mirrors M1 to M10 are placed in different positions in the z-axis direction in order to prevent a plurality of laser beams exiting from the mirrors M1 to M10 from crossing each other.

Particularly, the positions of the mirrors M1 to M10 in the z-axis direction are shifted, by respectively given amounts, in a direction approaching the corresponding semiconductor laser diodes (in the z-axis negative direction) as distance from the fast axis focusing lens FL increases (i.e. in the following order: the mirror M1, the mirror M2, ..., and the mirror M10). This is, as illustrated in FIG. 1, because the plurality of laser beams traveling to the mirrors M1 to M10 are inclined toward the fast axis focusing lens FL in respective amounts that increase with increasing proximity to the fast axis focusing lens FL. In order that a laser beam inclined toward the fast axis focusing lens FL in larger amount is allowed to be reflected by the corresponding mirror and then travel to the fast axis focusing lens FL, it is necessary to make a distance traveled by that laser beam from the corresponding semiconductor laser diode to the corresponding mirror longer than a distance traveled by other laser beams.

The amounts of the shifts of the positions of the mirrors M1 to M10 are smaller than intervals between the plurality of laser beams that enter the mirrors M1 to M10. With such a configuration, the plurality of laser beams emitted from the semiconductor laser diodes LD1 to LD10 travel to the fast axis focusing lens FL in a state that the intervals between the plurality of laser beams are made shorter by the mirrors M1 to M10.

[Configuration of Mirror]

Figure 3:
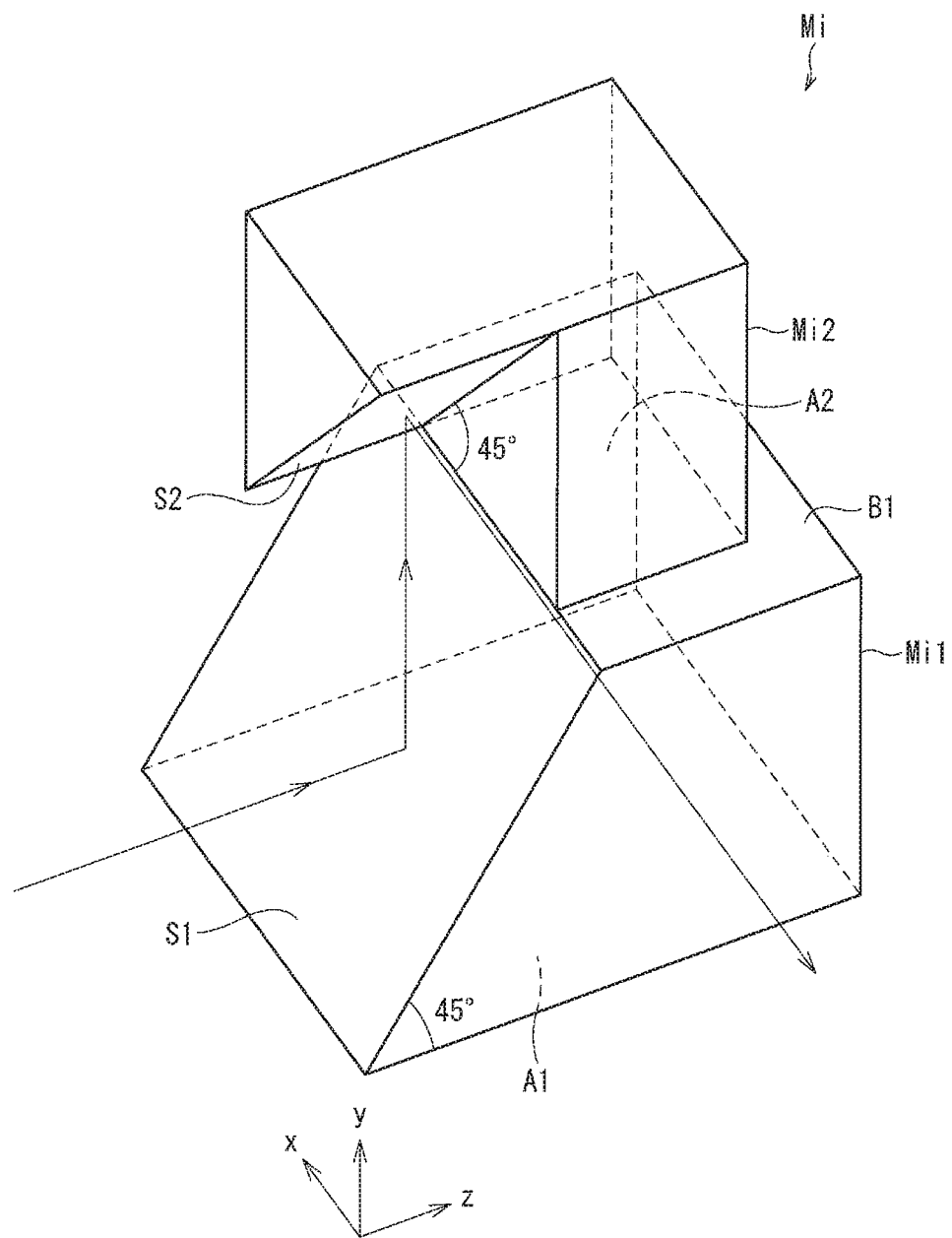
FIG. 3 is a perspective view illustrating the configuration of the mirror Mi provided in the LD module in accordance with the present embodiment.

Next, the following will describe the configuration of the mirror Mi provided in the LD module 1 in accordance with the present embodiment, with reference to FIG. 3. FIG. 3 is a perspective view illustrating the configuration of the mirror Mi provided in the LD module 1 in accordance with the present embodiment. FIG. 3 illustrates the configuration of one of the mirrors M1 to M10 provided in the LD module 1. It should be noted that the mirrors M1 to M10 are each configured similarly to the mirror Mi illustrated in FIG. 3.

As illustrated in FIG. 3, the mirror Mi is configured to include the first mirror Mi1 and the second mirror Mi2. The mirror Mi has a structure such that the first mirror Mi1 and the second mirror Mi2 are stacked so that a top surface B1 of the first mirror Mi1 overlaps a bottom surface A2 of the second mirror Mi2. The first mirror Mi1 is placed directly or indirectly on the surface of the sub-mount B so that a bottom surface A1 of the first mirror Mi1 becomes parallel to the x-z plane. It should be noted that the top surface B1 of the first mirror Mi1 and the bottom surface A2 of the second mirror Mi2 are parallel to the bottom surface A1. Further, the first mirror M11 and the second mirror Mi2 may be separate mirrors or may be integrated into a single mirror.

The first mirror Mi1 has a first reflection surface S1. The first reflection surface S1 converts the travel direction of a laser beam emitted from the semiconductor laser diode LDi from the z-axis positive direction to the y-axis positive direction. Thus, the first reflection surface S1 is configured so as to be substantially parallel to a slow axis of the laser beam and to form an angle of 45° with respect to an optical axis of the laser beam (i.e. an angle of 45° with respect to the bottom surface A1).

In a case where a tilt of the mirror Mi with respect to the laser beam is adjustable, the mirror Mi is preferably configured such that the tilt of the mirror Mi is adjusted so that the first reflection surface S1 becomes substantially parallel to the slow axis of the laser beam. This enables the mirror Mi to reflect the laser beam in a predetermined direction without causing unintended rotation of the laser beam or reflecting the laser beam in an unintended direction.

The second mirror Mi2 has a second reflection surface S2. The second reflection surface S2 converts a travel direction of a laser beam reflected by the first mirror Mi1 from the y-axis positive direction to the x-axis negative direction. Thus, the second reflection surface S2 is configured so as to be substantially parallel to a fast axis of the laser beam reflected by the first reflection surface and to form an angle of 45° with respect to the optical axis of the laser beam.

With such a relatively simple configuration of the mirror Mi that two reflection surfaces are combined as described above, setting the tilt of the mirror Mi with respect to a laser beam so that the laser beam enters the mirror Mi at a preset incidence angle (setting the first reflection surface S1 to be parallel to the slow axis of the laser beam) allows the mirror Mi to reflect a laser beam so that a laser beam entering the mirror Mi and a laser beam exiting the mirror Mi form a right angle when viewed from the y-axis positive direction.

Particularly, the LD module 1 in accordance with the present embodiment is configured such that the first reflection surface S1 of the mirror Mi is substantially parallel to a slow axis of a laser beam. This configuration is less likely to cause a defect such as unintended rotation of a laser beam or reflection of a laser beam in an unintended direction, as compared to a configuration such that the first reflection surface S1 and the slow axis of the laser beam are not substantially parallel to each other.

Similarly, the LD module 1 in accordance with the present embodiment is configured such that the second reflection surface S2 of the mirror Mi is substantially parallel to a fast axis of a laser beam. This configuration is less likely to cause a defect such as unintended rotation of a laser beam or reflection of a laser beam in an unintended direction, as compared to a configuration such that the second reflection surface S2 and the fast axis of the laser beam are not substantially parallel to each other.

In the LD module 1 in accordance with the present embodiment, configurations of all of the mirrors M1 to M10 are identical to the aforementioned configuration of the mirror Mi. That is, the LD module 1 can include the mirrors M1 to M10 all of which have configurations identical to the configuration of the mirror Mi. This eliminates the need to employ different configurations for the mirrors M1 to M10 or the need to perform different adjustments of the mirrors M1 to M10. Therefore, according to the LD module 1 in accordance with the present embodiment, it is possible to lower the cost of the LD module 1, and it is thus possible to realize the LD module 1 at low cost.

The mirror Mi is preferably configured such that the bottom surface of the second mirror and the top surface of the first mirror are bonded to each other with an adhesive agent. Particularly, it is preferable that the bottom surface of the second mirror and the top surface of the first mirror are parallel to a fast axis of a laser beam exiting from the mirror Mi (i.e. the x-z plane). Specifically, it is preferable that after the adhesive agent is applied between the bottom surface of the second mirror and the top surface of the first mirror, the bottom surface of the second mirror and the top surface of the first mirror are kept parallel to fast axes of a plurality of laser beams exiting from a plurality of mirrors until the adhesive agent is completely hardened. This makes it possible to make uniform a thickness of a resulting adhesive agent layer provided between the bottom surface of the second mirror and the top surface of the first mirror. Owing to such a uniform thickness of the adhesive agent layer, it is possible to avoid the occurrence of an event such as inclination of a direction of travel of an output beam or displacement of an optical axis of an output beam, even when the adhesive agent layer shrinks or expands. Shrinkage and expansion that may occur on the adhesive agent layer are assumed to be hardening shrinkage which may occur during hardening of the adhesive agent, thermal expansion that may occur after hardening of the adhesive agent, thermal shrinkage, swelling, and the like.

[Directions of Emissions of Laser Beams]

Figure 4:
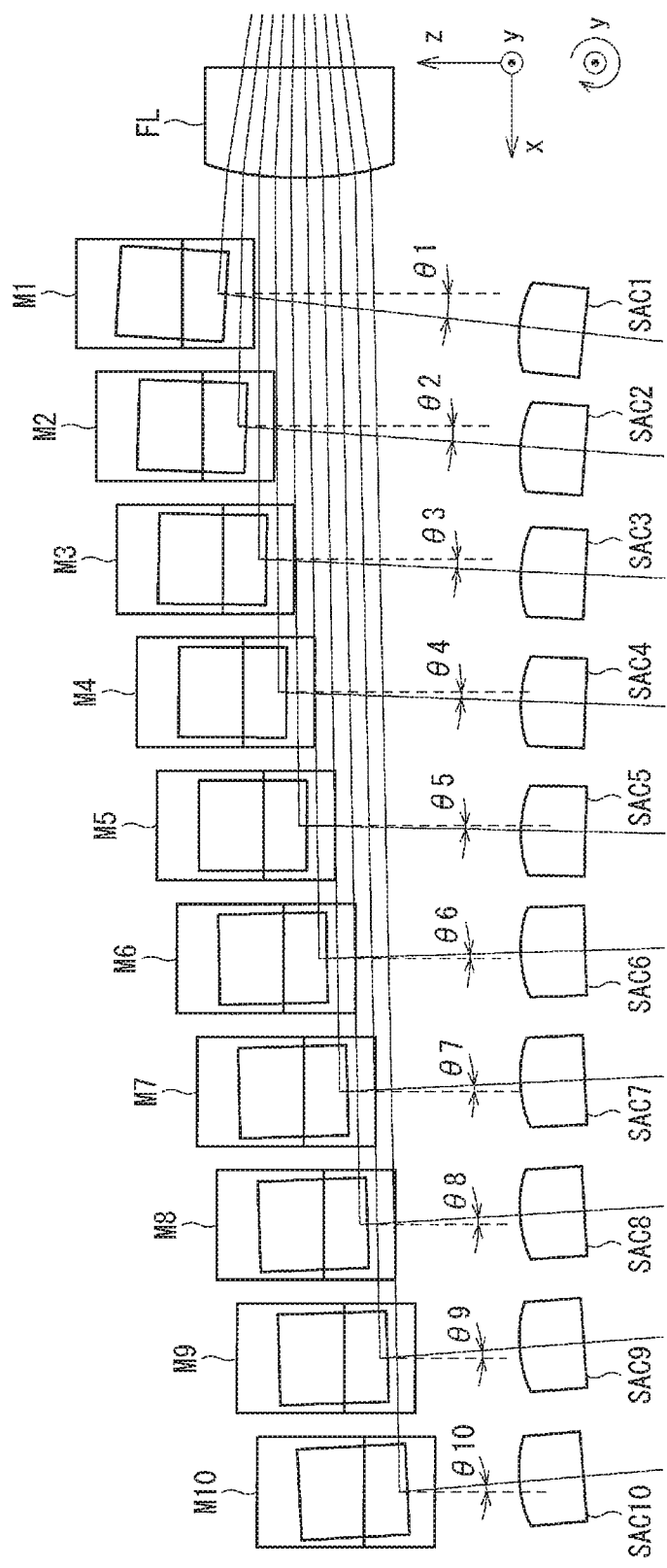
FIG. 4 is a plan view illustrating emission directions of the individual semiconductor laser diodes in the LD module in accordance with the present embodiment.

Next, the following will describe emission directions of the individual semiconductor laser diodes LD1 to LD10 with reference to FIG. 4. FIG. 4 is a plan view illustrating emission directions of the individual semiconductor laser diodes LD1 to LD10 in the LD module 1 in accordance with the present embodiment. In the following description, an inclination of the emission direction of the semiconductor laser diode LDi with respect to the z-axis is expressed by a rotation angle θi (wherein i is an integer from 1 to 10) about the y-axis as a rotation axis. For an inclination in the x-axis negative direction, the rotation angle θi is expressed as a positive value. For an inclination in the x-axis positive direction, the rotation angle θi is expressed as a negative value.

In the LD module 1 in accordance with the present embodiment, the setting of tilts of the individual mirrors M1 to M10 with respect to laser beams is made so that the laser beams enter the corresponding mirrors M1 to M10 at preset incidence angles which are identical to each other. Specifically, the tilts of the individual mirrors M1 to M10 with respect to laser beams are set so that the first reflection surfaces S1 (see FIG. 3) become surfaces substantially parallel to the slow axes of the laser beams. Furthermore, the mirrors M1 to M10 are configured such that, in the state in which the tilts of the mirrors M1 to M10 are set as described above, laser beams entering the mirrors M1 to M10 form a right angle with laser beams exiting from the mirrors M1 to M10 when viewed from the y-axis positive direction (see FIG. 3).

That is, in the LD module 1 in accordance with the present embodiment, exit directions in which a plurality of laser beams exit from the mirrors M1 to M10 are determined by travel directions of a plurality of laser beams entering the corresponding mirrors M1 to M10, not by adjustments of the mirrors M1 to M10.

Particularly, the LD module 1 in accordance with the present embodiment employs an arrangement in which a plurality of laser beams are allowed to travel to the fast axis focusing lens FL in a slightly focused state. In order to realize such an arrangement, the LD module 1 in accordance with the present embodiment is configured such that emission directions of the individual semiconductor laser diodes LD1 to LD10 are set, as illustrated in FIGS. 1 and 4, so that a plurality of laser beams are allowed to travel to the mirrors M1 to M10 in a slightly dispersed state. Consequently, a plurality of laser beams exiting from the mirrors M1 to M10 travel to the fast axis focusing lens FL in a slightly focused state and focus at a position closer to the fast axis focusing lens FL, as compared to the conventional technique.

This allows the LD module 1 in accordance with the present embodiment to bring an incident end face of the optical fiber OF at a position closer to the fast axis focusing lens FL, without having to decrease the curvature radius of the fast axis focusing lens FL. Thus, it is possible to achieve size reduction of an LD module, without decreasing the coupling efficiency of laser beams.

Further, the LD module 1 in accordance with the present embodiment allows for a decrease in maximum width of a beam bundle entering the fast axis focusing lens FL (the "beam bundle" as used herein refers to a light bundle formed by a plurality of laser beams), as compared to an LD module configured such that a plurality of laser beams being parallel to each other are allowed to enter the fast axis focusing lens FL. This makes it possible to reduce the influence of aberration of the fast axis focusing lens FL. Therefore, it is possible to prevent a decrease in coupling efficiency of laser beams.

Moreover, the LD module 1 in accordance with the present embodiment has a smaller incidence angle of laser beams entering the optical fiber OF after exiting from the fast axis focusing lens, as compared to an LD module configured such that a focal length of the fast axis focusing lens FL is decreased by decreasing the curvature radius of the fast axis focusing lens FL. Therefore, it is possible to bring the incident end face of the optical fiber OF at a position closer to the fast axis focusing lens FL, without leading to a decreased coupling efficiency.

Particularly, the LD module 1 in accordance with the present embodiment allows a plurality of laser beams to travel to the fast axis focusing lens FL in a slightly focused state, without the need for adjustment of the mirrors. With this arrangement, it is possible to prevent the occurrence of various defects that can possibly be caused by the adjustment of the mirrors. With the LD module 1 in accordance with the present embodiment, it is therefore possible to achieve size reduction of an LD module, without decreasing the coupling efficiency of laser beams.

For example, in the LD module 1 in accordance with the present embodiment (FIG. 4), the rotation angles θi of the mirrors M1 to M10 are set as below. This allows a plurality of laser beams to travel to the fast axis focusing lens FL in a slightly focused state.

θ1: 1.000°
θ2: 0.666°
θ3: 0.371°
θ4: 0.109°
θ5: −0.125°
θ6: −0.335°
θ7: −0.525°
θ8: −0.698°
θ9: −0.856°
θ10: −1.000°

In this example, emission directions of the individual semiconductor laser diodes LD1 to LD10 are set so that the semiconductor laser diodes LD1 to LD10 have the rotation angles θi of which absolute values decrease with increasing proximity to the middle of the laser diode array, that is, so that absolute values of the rotation angles θi increase with decreasing proximity to the middle of the laser diode array (in other words, so that the emission directions point outwards to a greater extent).

With this arrangement, a plurality of laser beams emitted from the semiconductor laser diodes LD1 to LD10 travel while spreading outward from a middle section of the bundle of the laser beams, as illustrated in FIG. 4. In contrast, as illustrated in FIGS. 1 and 4, a plurality of laser beams exiting from the mirrors M1 to M10 travel while focusing to the middle section of the bundle of the laser beams. By allowing such laser beams to enter the optical fiber, it is possible to further increase coupling efficiency of laser beams.

In the LD module 1 in accordance with the present embodiment, since a laser beam entering the mirror Mi and a laser beam exiting from the mirror Mi form a right angle, an angle of an inclination θi of a laser beam entering the mirror Mi in a direction that spreads out about the z-axis (inclination in the slow axis direction) is identical to an angle of an inclination θi' of a laser beam exiting from the mirror Mi in a direction that focuses about the x-axis (inclination in the fast axis direction).

[Confirmation of Effect]

Figure 5:
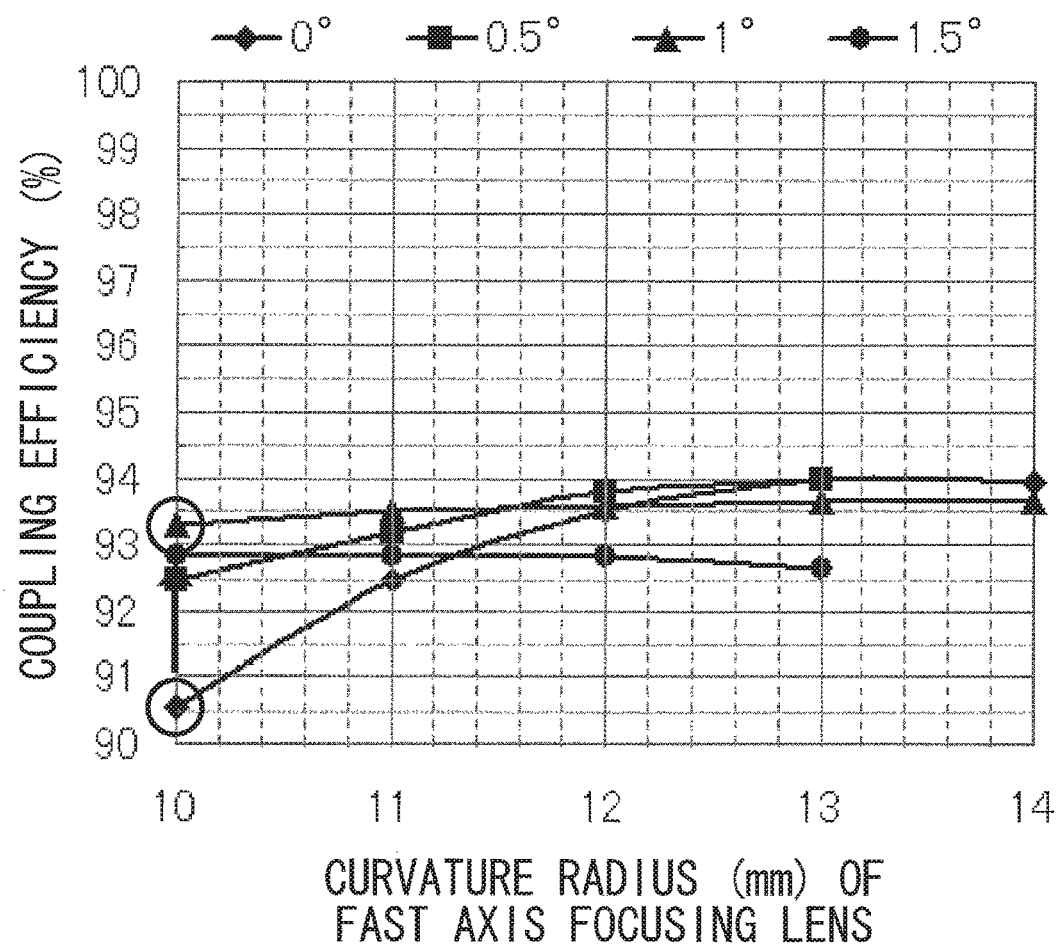
FIG. 5 is a graph showing a relation between curvature radius of a fast axis focusing lens and coupling efficiency achieved when a beam bundle enters an incident end face of an optical fiber.
Figure 6:
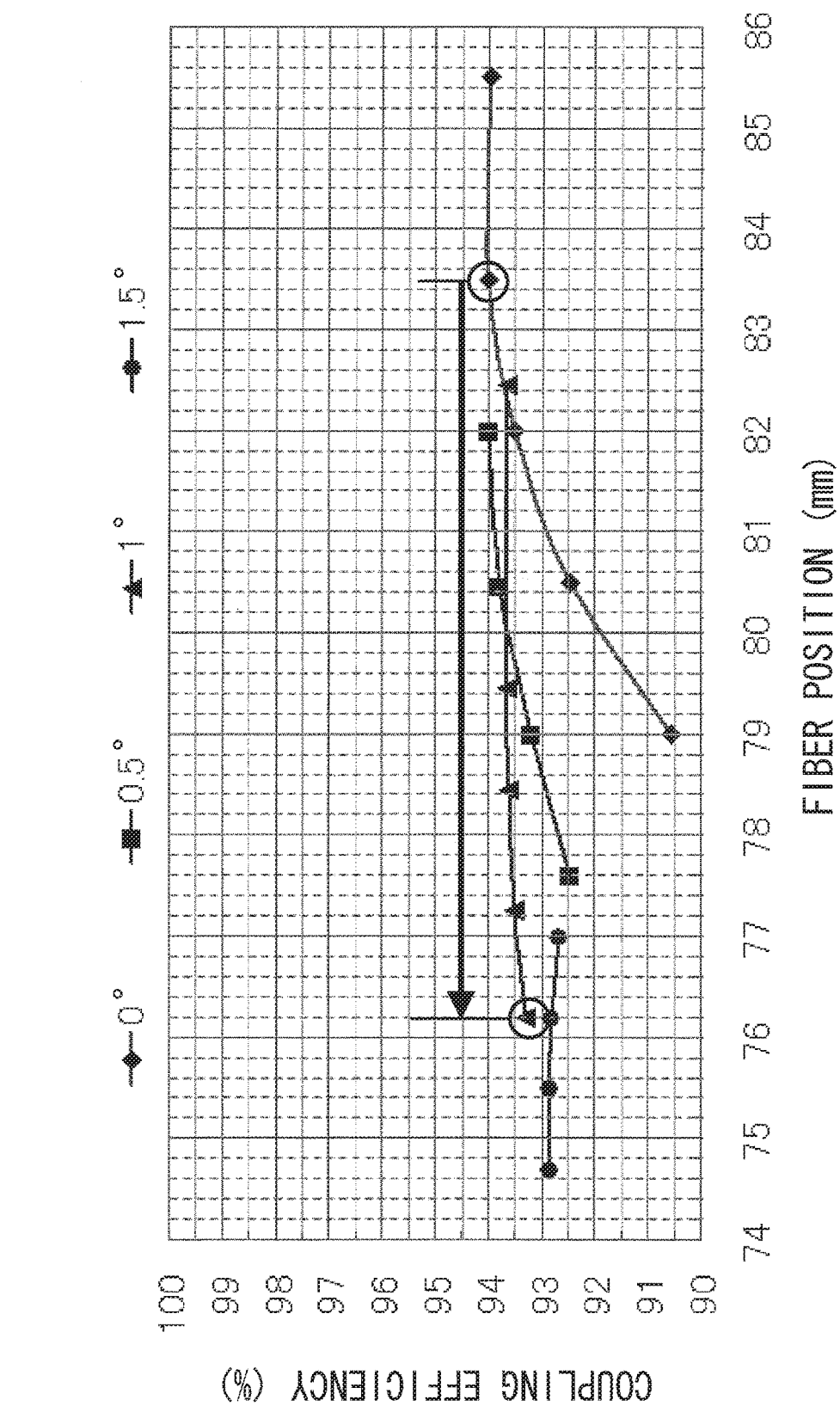
FIG. 6 is a graph showing a relation between a fiber position and coupling efficiency achieved when the beam bundle enters the incident end face of the optical fiber.

With reference to FIGS. 5 and 6, the following will describe an effect obtained by employing the arrangement in which a plurality of laser beams are allowed to travel to the fast axis focusing lens FL in a slightly focused state.

FIG. 5 is a graph showing a relation between curvature radius of the fast axis focusing lens FL and coupling efficiency achieved when the beam bundle enters the incident end face of the optical fiber OF. In the graph shown in FIG. 5, a horizontal axis represents curvature radius (unit: mm) of the fast axis focusing lens FL, and a vertical axis represents coupling efficiency (unit: %) achieved when the beam bundle enters the optical fiber OF. FIG. 5 shows coupling efficiencies achieved when a maximum value of the rotation angle θi (hereinafter referred to as "maximum rotation angle θ") is 0°, 0.5°, 1°, and 1.5°.

As shown in FIG. 5, in a case where the maximum rotation angle θ is 0°, i.e. in a case where a plurality of laser beams travel in parallel to each other, a decrease in curvature radius of the fast axis focusing lens FL decreases coupling efficiency of the beam bundle to be coupled into the optical fiber OF. Such a decreased coupling efficiency is ascribable to an increase of laser beam components having incidence angles exceeding an acceptance angle of the optical fiber OF due to an increase in incidence angles of the laser beams in entering the optical fiber OF.

In contrast, in a case where the maximum rotation angle θ is greater than 0°, i.e. in a case where a plurality of laser beams cross each other at one point, a decrease in curvature radius of the fast axis focusing lens FL decreases coupling efficiency of the beam bundle to be coupled into the optical fiber OF. However, the maximum rotation angle θ of greater than 0° results in a smaller degree of decrease in coupling efficiency than the maximum rotation angle θ of 0°. Particularly, in a case where the maximum rotation angle θ is 1°, a value of coupling efficiency achieved with the fast axis focusing lens FL having curvature radius of 10 mm is higher by approximately 3% than that in a case where the maximum rotation angle θ is 0°. This is considered ascribable to smaller incidence angles of the laser beams to enter the optical fiber OF than the incidence angles of the laser beams to enter the optical fiber OF in a case where the maximum rotation angle θ is 0°.

FIG. 6 is a graph showing a relation between a fiber position and coupling efficiency achieved when the beam bundle enters the incident end face of the optical fiber OF. Here, the fiber position refers to a distance between (a) some point on an imaginary line which passes through the center of the semiconductor laser diode LD1 and is parallel to the z-axis and (b) the incident end face of the optical fiber OF. In the graph shown in FIG. 6, a horizontal axis represents the fiber position (unit: mm), and a vertical axis represents coupling efficiency (unit: %) achieved when the bundle of output beams enters the optical fiber OF. Similarly, FIG. 6 shows coupling efficiencies achieved when the maximum rotation angle θ is 0°, 0.5°, 1°, and 1.5°.

As shown in FIG. 6, in a case where the maximum rotation angle θ is 0°, i.e. in a case where optical axes of the output beams are parallel to each other, an increase in proximity of the incident end face of the optical fiber OF to the fast axis focusing lens FL decreases coupling efficiency of the beam bundle to be coupled into the optical fiber OF. Such a decreased coupling efficiency is ascribable to an increase of laser beam components having incidence angles exceeding an acceptance angle of the optical fiber OF due to an increase in incidence angles of the output beams in entering the incident end face of the optical fiber OF.

In contrast, in a case where the maximum rotation angle θ is greater than 0°, i.e. in a case where optical axes of output beams cross each other at one point, an increase in proximity of the incident end face of the optical fiber OF to the fast axis focusing lens FL decreases coupling efficiency of the bundle of output beams to be coupled into the optical fiber OF. However, the maximum rotation angle θ of greater than 0° results in a smaller degree of decrease in coupling efficiency than the maximum rotation angle θ of 0°. Particularly, in a case where the maximum rotation angle θ is 1°, it is clear that the incident end face of the optical fiber OF can be brought closer by 7 mm to an exit surface of the fast axis focusing lens FL while a decrease in coupling efficiency is limited to less than 1%. This is considered ascribable to smaller incidence angles of the laser beams to enter the optical fiber OF than the incidence angles of the laser beams to enter the optical fiber OF in a case where the maximum rotation angle θ is 0°.

As described above, the LD module in accordance with the present invention is configured, as illustrated in FIG. 1, such that the plurality of semiconductor laser diodes LD1 to LD10 emit a plurality of laser beams toward the corresponding plurality of mirrors M1 to M10 so that that intervals between adjacent ones of the laser beams gradually increase, and that the plurality of mirrors M1 to M10 reflect a plurality of laser beams toward the fast axis focusing lens FL so that intervals between adjacent ones of the laser beams gradually decrease.

With such a configuration, it is possible to achieve size reduction of an LD module without decreasing coupling efficiency of laser beams.

EXAMPLES

Figure 7:
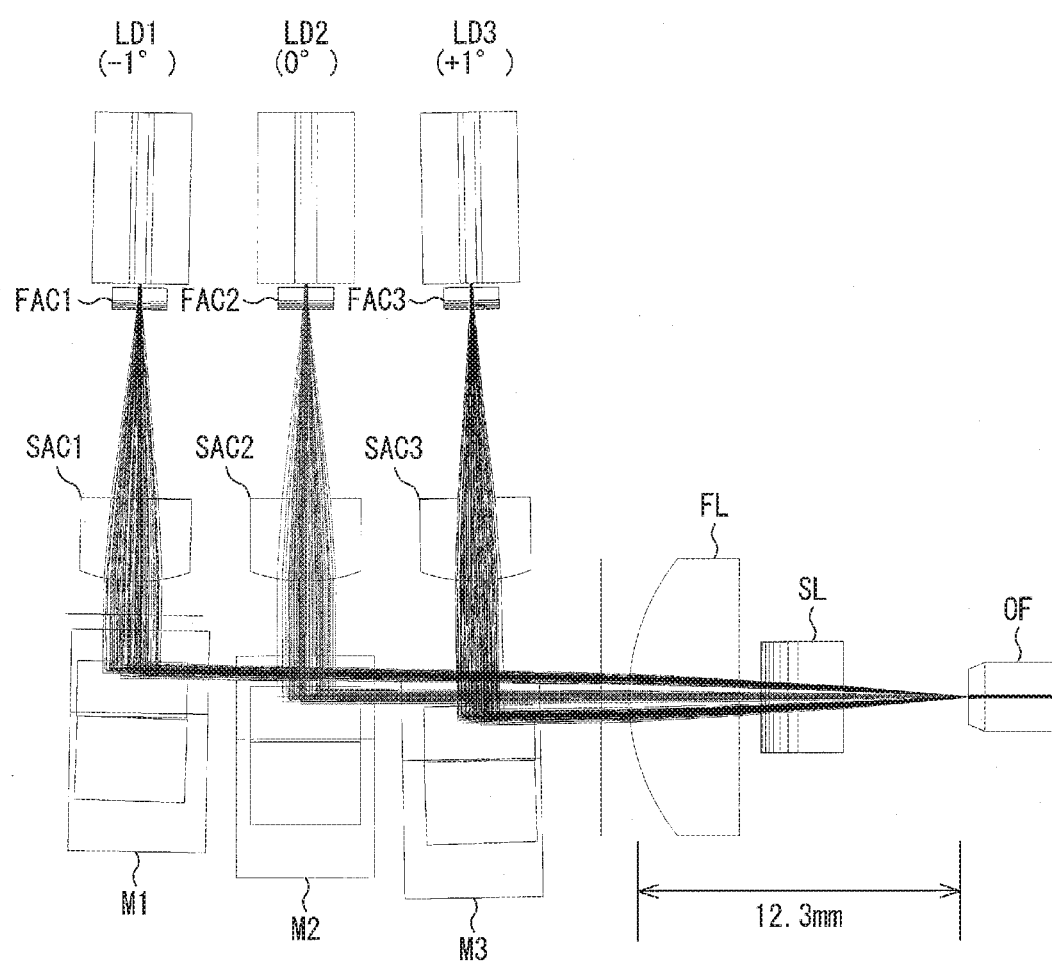
FIG. 7 is a view schematically illustrating the configuration of an LD module in Example of the present embodiment.
Figure 8:
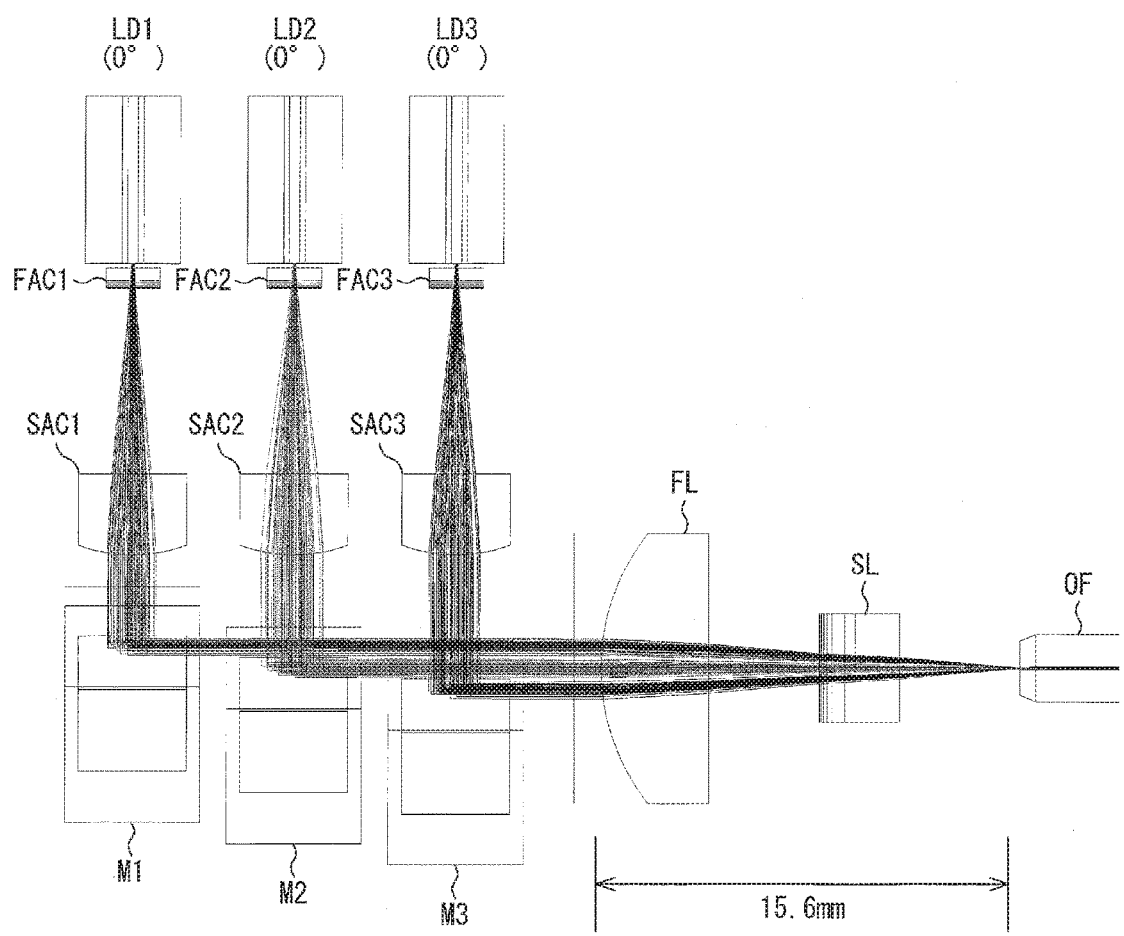
FIG. 8 is a view schematically illustrating the configuration of an LD module in Comparative Example of the present embodiment.

The following will describe Example of the LD module 1 in accordance with the present embodiment and Comparative Example with reference to FIGS. 7 and 8.

Example

FIG. 7 schematically illustrates the configuration of an LD module in Example of the present embodiment.

In the Example of the present embodiment, the LD module illustrated in FIG. 7 is used, and a distance which the LD module illustrated in FIG. 7 requires to focus a plurality of laser beams (i.e. a distance required to reach the position of the incident end face of the optical fiber OF) was measured.

The LD module in Example of the present embodiment is configured to include semiconductor laser diodes LD1 to LD3, fast axis collimating lenses FAC1 to FAC3, slow axis collimating lenses SAC1 to SAC3, mirrors M1 to M3, a fast axis focusing lens FL, and a slow axis condensing lens SL (see FIG. 7). That is, the LD module in the Example (FIG. 7) of the present embodiment differs from the LD module 1 in accordance with the present embodiment (FIG. 1) in that three laser beams are coupled into the optical fiber OF.

For the LD module illustrated in FIG. 7, parameters of the constituent components were set as follows.

Rotation angle θ of the semiconductor laser diode LD1: −1°

Rotation angle θ of the semiconductor laser diode LD2: 0°

Rotation angle θ of the semiconductor laser diode LD3: +1°

Curvature radius of the fast axis focusing lens FL: 6.9 mm

Curvature radius of the slow axis condensing lens SL: 3.5 mm

That is, the LD module in the Example of the present embodiment employs, similarly to the LD module 1 in accordance with the present embodiment (FIG. 1), an arrangement in which a plurality of laser beams travel to a corresponding plurality of mirrors in a slightly dispersed state, and a plurality of laser beams travel to the fast axis focusing lens FL in a slightly focused state.

Comparative Example

FIG. 8 schematically illustrates the configuration of an LD module in Comparative Example of the present embodiment. The LD module illustrated in FIG. 8 differs from the LD module in the Example (FIG. 7) in rotation angles θ of the semiconductor laser diodes. In the other points, the LD module illustrated in FIG. 8 is identical to the LD module in the Example (FIG. 7).

For the LD module illustrated in FIG. 8, parameters of the constituent components were set as follows.

Rotation angle θ of the semiconductor laser diode LD1: 0°

Rotation angle θ of the semiconductor laser diode LD2: 0°

Rotation angle θ of the semiconductor laser diode LD3: 0°

Curvature radius of the fast axis focusing lens FL: 6.9 mm

Curvature radius of the slow axis condensing lens SL: 3.5 mm

That is, the LD module in the Comparative Example employs, unlike the LD module 1 in accordance with the present embodiment (FIG. 1), an arrangement in which a plurality of laser beams travel in parallel to each other to a corresponding plurality of mirrors, and a plurality of laser beams travel in parallel to each other to the fast axis focusing lens FL.

[Implementation Result]

As a result of implementing the Example, it was shown that a distance which the LD module illustrated in FIG. 7 requires from an entrance surface of the fast axis focusing lens FL to the incident end face of the optical fiber OF was 12.3 mm. As a result of implementing the Comparative Example, it was shown that a distance which the LD module illustrated in FIG. 8 requires from an entrance surface of the fast axis focusing lens FL to the incident end face of the optical fiber OF was 15.6 mm. That is, it was shown that, by allowing a plurality of laser beams to travel to the fast axis focusing lens FL in a slightly focused state, it is possible to greatly decrease a distance from the entrance surface of the fast axis focusing lens FL to the incident end face of the optical fiber OF.

The LD module in the Example employs a configuration in which the fast axis collimating lens FACi is positioned offset slightly (by 3 μm) from the emission end face of the semiconductor laser diode LDi in the z-axis positive direction (i.e. in a direction of travel of a laser beam emitted from the semiconductor laser diode LDi). With such a configuration, a laser beam exiting from the fast axis collimating lens FACi travels toward the incident end face of the optical fiber OF while gradually decreasing a beam diameter that extends in the fast axis direction. This allows the LD module 1 in the Example of the present embodiment to condense laser beams at the incident end face of the optical fiber OF and thus enables a laser beam emitted from the individual semiconductor laser diode LDi to be more efficiently coupled into the optical fiber OF.

In the above LD module, the plurality of mirrors are preferably configured such that a corresponding one of the laser beams entering the mirrors and a corresponding one of the laser beams exiting from the mirrors form a right angle when viewed from a direction vertical to both of the laser beams.

The above configuration allows each of the mirrors to have a relatively simple configuration and thus enables preventing the occurrence of the aforementioned defects. Particularly, in a case where mirrors each configured with a combination of a plurality of reflecting surfaces are to be used, employing the above configuration allows the effect of preventing the aforementioned defects to be more significant.

In the above LD module, it is preferable that the first mirrors have respective first reflection surfaces which (i) are parallel to slow axes of the laser beams entering the mirrors and (ii) form an angle of 45° with respect to optical axe of the laser beams, and the second mirrors have respective second reflection surfaces which (i) are parallel to fast axe of the laser beams reflected by the first reflection surfaces and (ii) form an angle of 45° with respect to optical axe of the laser beams.

With the above configuration, twisting of beams due to reflections by the first mirrors and the second mirrors are less likely to occur.

In the above LD module, it is preferable that emission directions of the plurality of semiconductor laser diodes are set so that emission directions of corresponding ones of the semiconductor laser diodes placed at more outward positions in the laser diode array point outwards to a greater extent.

With the above configuration, a plurality of laser beams emitted from a plurality of semiconductor laser diodes travel while spreading outward from a middle section of the bundle of the laser beams (the middle of the beam bundle). In contrast, a plurality of laser beams exiting from a plurality of mirrors travel while focusing to the middle section of the bundle of the laser beams (the middle of the beam bundle). By allowing such laser beams to enter the optical fiber, it is possible to further increase coupling efficiency of laser beams.

In the above LD module, it is preferable that the LD module further includes a plurality of fast axis collimating lenses provided on optical paths of the plurality of laser beams emitted from the corresponding plurality of laser diodes, the plurality of fast axis collimating lenses are offset in directions of travel of the corresponding laser beams with reference to positions at which the laser beams spreading out in the fast axis direction are collimated, and amounts of offset of the fast axis collimating lenses are set so that beam diameters of the laser beams in the fast axis direction are minimized at a crossing point of the plurality of laser beams focused by the fast axis focusing lenses.

With the above configuration, beam diameters of the laser beams are minimized at the crossing point. This makes it possible to further increase coupling efficiency achieved when a beam bundle consisting of the plurality of laser beams enters an optical fiber.

In the above LD module, it is preferable that bottom surfaces of the second mirrors and top surfaces of the first mirrors are bonded to each other, and the bottom surfaces of the second mirrors and the top surfaces of the first mirrors are parallel to fast axes of the plurality of laser beams emitted from the plurality of mirrors.

With the above configuration, uniform thicknesses of adhesive agent layers provided between the bottom surfaces of the second mirrors and the top surfaces of the first mirrors make it possible to avoid the occurrence of an event such as inclination of a direction of travel of an output beam or displacement of an optical axis of an output beam, even when these adhesive agent layers shrink or expand.

[Additional Notes]

The present invention is not limited to the embodiments, but can be altered by a person skilled in the art within the scope of the claims. An embodiment derived from a proper combination of technical means appropriately altered within the scope of the claims is also encompassed in the technical scope of the present invention.

(The Number of Unit Optical Systems (Laser Beams))

The LD module 1 in accordance with the present embodiment includes 10 unit optical systems in order to couple 10 laser beams. This is not intended to limit the present invention. That is, the LD module 1 may be operated as an LD module including 9 unit optical systems or fewer, or may be operated as an LD module including 11 unit optical systems or more.

(Installation Locations of Constituent Components)

The LD module 1 in accordance with the present embodiment is, as illustrated in FIG. 1, such that the constituent components are provided on a surface of a single sub-mount B. This is not intended to limit the present invention. For example, an alternative configuration may be employed in which some of the constituent components are provided outside the sub-mount B. For example, such an alternative configuration can be a configuration in which the fast axis focusing lens FL and the slow axis condensing lens SL are provided outside the sub-mount B (for example, on a second sub-mount or the like) or a configuration in which the slow axis condensing lens SL is provided outside the sub-mount B.

For the LD module 1 in accordance with the present embodiment, a configuration may be employed in which the position of the fast axis collimating lens FACi is offset from a reference position in the z-axis positive direction (i.e. in a direction of travel of a laser beam emitted from the semiconductor laser diode LDi). The reference position refers to a position at which the fast axis collimating lens FACi exerts the effect of collimating a laser beam (i) emitted from the semiconductor laser diode LDi and (ii) spreading out in the fast axis direction. The fast axis collimating lens FACi which is offset from the reference position in the direction of travel of a laser beam exerts the effect of condensing a laser beam emitted from the semiconductor laser diode LDi. i.e. the effect of gradually decreasing beam diameters of the laser beams.

Particularly, the LD module 1 in accordance with the present embodiment is preferably such that the offset amount of the fast axis collimating lens FACi is set on an individual basis so that beam diameters of output beams are minimized at a crossing point of a bundle of the output beams. For example, it is preferable that the offset amount $\Delta i$ of the individual fast axis collimating lens FACi is set to $\Delta 1 > \Delta 2 > \ldots > \Delta 10$ so that beam diameters of output beams are minimized at the crossing point.

The conventional LD module, in order to optimize beam diameters of output beams, included additional lenses for adjusting the beam diameters. In contrast, the LD module 1 in accordance with the present embodiment, as described above, adjusts the offset amount of the fast axis collimating lens FACi to optimize the beam diameters of the output beams. This eliminates the need for additional lenses for adjusting the beam diameters. Therefore, according to the LD module 1 in accordance with the present embodiment, it is possible to lower the cost of the LD module 1, and it is thus possible to realize the LD module 1 at low cost.

INDUSTRIAL APPLICABILITY

The present invention is suitably applicable to an LD module. The present invention is suitably applicable particularly to an LD module including semiconductor laser diodes as a light source.

REFERENCE SIGNS LIST

1 LD module
LD1 to LD10 Semiconductor laser diodes (laser diodes)
FAC1 to FAC10 Fast axis collimating lenses
SAC1 to SAC10 Slow axis collimating lenses
M1 to M10 Mirrors
Mi1 First mirror
S1 Reflection surface (first reflection surface)
Mi2 Second mirror
S2 Reflection surface (second reflection surface)
B Sub-mount (substrate)
FL Fast axis focusing lens (focusing lens)
SL Slow axis condensing lens
OF Optical fiber

The invention claimed is:

1. An LD module comprising:
a plurality of laser diodes forming a laser diode array;
a plurality of fast axis collimating lenses provided on optical paths of a plurality of laser beams emitted from the corresponding plurality of laser diodes;
a plurality of mirrors which reflect the plurality of laser beams emitted from the corresponding plurality of laser diodes, in slow axis directions of the laser beams; and
a fast axis focusing lens which focuses the plurality of laser beams reflected by the plurality of mirrors, so that the plurality of laser beams cross each other;
the plurality of laser diodes emitting the plurality of laser beams toward the corresponding plurality of mirrors so that intervals between adjacent ones of the laser beams gradually increase,
the plurality of mirrors reflecting the plurality of laser beams toward the fast axis focusing lens so that intervals between adjacent ones of the laser beams gradually decrease,
the plurality of mirrors being configured to include:
respective first mirrors; and
respective second mirrors,
the first mirrors each reflecting, in a fast axis direction, a corresponding one of the laser beams entering the mirrors; and
the second mirrors each reflecting, in a slow axis direction, the corresponding one of the laser beams reflected by the first mirrors,
the plurality of laser beams being such that a fast axis of a corresponding one of the laser beams entering the first mirrors is parallel to a slow axis of a corresponding one of the laser beams exiting from the second mirrors.

2. The LD module according to claim 1, wherein the plurality of mirrors are configured such that a corresponding one of the laser beams entering the mirrors and a corresponding one of the laser beams exiting from the mirrors form a right angle when viewed from a direction vertical to both of the laser beams.

3. The LD module according to claim 2, wherein the first mirrors have respective first reflection surfaces which (i) are parallel to slow axes of the laser beams entering the mirrors and (ii) form an angle of 45° with respect to optical axe of the laser beams, and the second mirrors have respective second reflection surfaces which (i) are parallel to fast axe of the laser beams reflected by the first reflection surfaces and (ii) form an angle of 45° with respect to optical axe of the laser beams.

4. The LD module according to claim 1, wherein emission directions of the plurality of semiconductor laser diodes are set so that emission directions of corresponding ones of the semiconductor laser diodes placed at more outward positions in the laser diode array point outwards to a greater extent.

5. The LD module according to claim 1, wherein the plurality of fast axis collimating lenses are offset in directions of travel of the corresponding laser beams with reference to positions at which the laser beams spreading out in the fast axis direction are collimated, and amounts of offset of the fast axis collimating lenses are set so that beam diameters of the laser beams in the fast axis direction are minimized at a crossing point of the plurality of laser beams focused by the fast axis focusing lenses.

6. The LD module according to claim 1, wherein bottom surfaces of the second mirrors and top surfaces of the first mirrors are bonded to each other, and the bottom surfaces of the second mirrors and the top surfaces of the first mirrors are parallel to fast axes of the plurality of laser beams emitted from the plurality of mirrors.

7. An LD module as set forth in claim 1, wherein:
the plurality of laser diodes and the plurality of mirror are provided on a plane defined by a first axis direction and a second axis direction, and the emission directions of the respective plurality of laser diodes are set such that the laser diodes have rotation angles of which absolute values decrease with increasing proximity to a middle of a laser diode array and absolute values of the rotation angles increase with decreasing proximity to the middle of the laser diode array, where the first axis direction (x axis direction) is an optical axis direction of the fast axis focusing lens, the second axis direction (z axis direction) is a direction orthogonal to the first axis direction, the third axis direction (y axis direction) is a direction orthogonal to a plane formed by the first axis direction and the second axis direction, and an inclination of the emission direction of the laser diode is expressed by a rotation angle ($\theta i=1$ to 10) about the third axis direction as a rotation axis.

* * * * *